(12) United States Patent
Lewis et al.

(10) Patent No.: US 11,169,581 B1
(45) Date of Patent: Nov. 9, 2021

(54) COVER INTERLOCK MECHANISM

(71) Applicant: EMC IP Holding Company LLC, Hopkinton, MA (US)

(72) Inventors: Jeffrey Michael Lewis, Maynard, MA (US); Joseph L. Brigham, Jr., North Attleboro, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 16/885,769

(22) Filed: May 28, 2020

(51) Int. Cl.
*G06F 1/18* (2006.01)
*H05K 5/03* (2006.01)
*H05K 5/02* (2006.01)

(52) U.S. Cl.
CPC .............. *G06F 1/187* (2013.01); *H05K 5/023* (2013.01); *H05K 5/0221* (2013.01); *H05K 5/0226* (2013.01); *H05K 5/03* (2013.01)

(58) Field of Classification Search
None
See application file for complete search history.

(56) References Cited

U.S. PATENT DOCUMENTS

| | | | | |
|---|---|---|---|---|
| 5,486,982 A * | 1/1996 | Hsu | ............ | G06F 1/183 312/223.1 |
| 6,351,379 B1 * | 2/2002 | Cheng | ............ | G11B 33/128 312/332.1 |
| 6,456,501 B1 * | 9/2002 | Rubenstein | ............ | G11B 33/128 211/41.17 |
| 6,848,662 B2 * | 2/2005 | Paramonoff | ............ | E05C 3/14 248/222.11 |
| 6,999,308 B2 * | 2/2006 | Hsu | ............ | G06F 1/184 248/27.1 |
| 7,380,843 B2 * | 6/2008 | Alacqua | ............ | E05B 47/0009 292/137 |
| 7,423,869 B2 * | 9/2008 | Su | ............ | G06F 1/187 312/223.2 |
| 7,523,901 B2 * | 4/2009 | Wu | ............ | G11B 33/128 211/162 |
| 7,770,391 B2 * | 8/2010 | Melz | ............ | F03G 7/065 60/527 |
| 8,218,315 B2 * | 7/2012 | Lu | ............ | G06F 1/187 361/679.58 |
| 8,264,824 B2 * | 9/2012 | Makley | ............ | G11B 33/124 361/679.01 |

(Continued)

*Primary Examiner* — Xanthia C Cunningham
(74) *Attorney, Agent, or Firm* — Muirhead and Saturnelli, LLC (57) ABSTRACT

A cover interlock mechanism for drawer in a rack enclosure includes a first protrusion and a second protrusion coupled to opposing sides of the drawer, the protrusions being urged outward from the drawer, at least one structural component of the rack enclosure that engages the protrusions to prevent the drawer from being inserted into the rack enclosure, and a cover for the drawer having cavities that align with the protrusions when the cover is placed on the drawer to urge the protrusions toward the drawer to allow the drawer to be inserted into the rack enclosure. The protrusions may be urged outward from the drawer by flexible members attached to the drawer. The flexible members may be attached to bottom portions of sides of the drawer. The structural component may be a rail of the rack enclosure. The rail may be part of the framework of the rack enclosure.

20 Claims, 6 Drawing Sheets

(56) References Cited

U.S. PATENT DOCUMENTS

| | | | | |
|---|---|---|---|---|
| 8,462,493 | B2* | 6/2013 | Sun | G11B 33/124 |
| | | | | 361/679.39 |
| 8,512,055 | B2* | 8/2013 | Lu | H05K 7/1492 |
| | | | | 439/160 |
| 9,271,411 | B2* | 2/2016 | Liao | H05K 7/1417 |
| 9,609,778 | B1* | 3/2017 | Spencer | H05K 7/1489 |
| 9,795,052 | B2* | 10/2017 | Hsiao | H05K 5/023 |
| 10,206,302 | B2* | 2/2019 | Liao | H05K 7/1417 |
| 10,264,698 | B2* | 4/2019 | Kho | H05K 7/1492 |
| 10,798,837 | B1* | 10/2020 | Sauer | H05K 7/1488 |
| 10,834,842 | B1* | 11/2020 | Elsasser | H05K 7/1489 |
| 2004/0057201 | A1* | 3/2004 | Hartung | G11B 25/043 |
| | | | | 361/679.4 |
| 2005/0104486 | A1* | 5/2005 | Huang | H05K 5/0013 |
| | | | | 312/223.2 |
| 2005/0212390 | A1* | 9/2005 | Silvestro | A47B 88/43 |
| | | | | 312/334.4 |
| 2007/0053150 | A1* | 3/2007 | Lee | G11B 23/0316 |
| | | | | 174/365 |
| 2010/0007252 | A1* | 1/2010 | Liu | H05K 7/1487 |
| | | | | 312/223.2 |
| 2015/0201520 | A1* | 7/2015 | Jau | G11C 11/40611 |
| | | | | 211/26 |
| 2015/0250312 | A1* | 9/2015 | Barrett | A47B 88/463 |
| | | | | 312/319.1 |
| 2015/0316964 | A1* | 11/2015 | Albert | G11B 33/128 |
| | | | | 361/679.36 |
| 2017/0150634 | A1* | 5/2017 | Huang | H05K 5/023 |
| 2017/0364128 | A1* | 12/2017 | Schroeder | G06F 1/181 |
| 2018/0197579 | A1* | 7/2018 | Chen | H05K 7/14 |
| 2018/0228049 | A1* | 8/2018 | Liao | A47B 88/477 |
| 2019/0364681 | A1* | 11/2019 | Hangebrauck | E05C 1/02 |
| 2020/0340272 | A1* | 10/2020 | Westphall | H05K 7/1487 |

* cited by examiner

COVER INTERLOCK MECHANISM

TECHNICAL FIELD

This application relates to the field of racks for electrical components and, more particularly, to the field of covers for field replaceable units used in enclosures for racks for electrical components.

BACKGROUND OF THE INVENTION

Rack enclosures are used to house electrical components that provide relatively complex electrical/electronic systems. The rack enclosures may include brackets that hold circuit boards or similar electronic components in the rack enclosure and may include connectors that make electrical connections to the circuit boards. The connectors supply power to the circuit boards and allow exchanging data signals with the circuit boards. In some cases, the circuit boards or similar components of a rack enclosure may be provided as field replaceable units that may be removed from and inserted into the rack enclosure without disrupting other portions of the system in the rack enclosure.

One mechanism for inserting and removing field replaceable units in a rack enclosure is to provide one or more drawers that slide in and out of the rack enclosure. The drawers may be electrically connected to other components of the rack enclosure (also possibly in drawers) using flexible cables or similar so that the drawer and components thereof remain electrically connected as the drawer is slid in and out of the rack enclosure. A drawer may also include a cover that protects components inside the drawer and allows for separately cooling the components using fans embedded in the drawer.

In many cases, it is important that the drawer is not inserted into the rack enclosure without a cover. For example, a system may be designed with specific cooling requirements for components of the drawer that are only met when the cover is provided because of relationship between fans used for the drawer and expected intake ports for the drawers. It is also possible that omitting the cover will result in heat from other parts of the rack enclosure reaching components of the drawer. Of course, technicians that work on the rack enclosure and the drawers are instructed to always replace the cover. Nonetheless, it is possible for a technician to improperly not replace the cover for any number of reasons, including the technician not being trained properly, not appreciating the importance of the cover, etc. Whatever the reason, the result could be failure of one or more components and possibly even damage to some components due to excessive heat.

A solution to the problem of a technician omitting a cover to a drawer is to attach the cover to the drawer using a hinge. The drawer is slid out and the cover is lifted on the hinge to allow removal and replacement of components. However, the cover in a lifted state could block access to other components and, in some cases, could block air flow for other components, thus creating overheating of other components while components of the drawer are being replaced.

Accordingly, it is desirable to provide a mechanism that allows a cover for a drawer in a rack enclosure to be removed entirely during maintenance but ensures that the cover is placed back on the drawer before the drawer is reinserted into the rack enclosure.

SUMMARY OF THE INVENTION

According to the system described herein, a cover interlock mechanism for drawer in a rack enclosure includes a first protrusion and a second protrusion coupled to opposing sides of the drawer, the protrusions being urged outward from the drawer, at least one structural component of the rack enclosure that engages the protrusions to prevent the drawer from being inserted into the rack enclosure, and a cover for the drawer having cavities that align with the protrusions when the cover is placed on the drawer to urge the protrusions toward the drawer to allow the drawer to be inserted into the rack enclosure. The protrusions may be urged outward from the drawer by flexible members attached to the drawer. The flexible members may be attached to bottom portions of sides of the drawer. The at least one structural component may be a rail of the rack enclosure. The rail may be part of the framework of the rack enclosure. The cover may include a handle for lifting the cover off of the drawer. The handle may be attached to the cover by a hinge. The hinge may allow the handle to be folded flush with the cover. Components of the drawer may include a disk drive and/or a solid state storage device. The drawer may be part of an array storage device.

According further to the system described herein, preventing a drawer in a rack enclosure from sliding into the rack enclosure without a cover includes urging a first protrusion and a second protrusion, coupled to opposing sides of the drawer, outward from the drawer, engaging the protrusions to prevent the drawer from being inserted into the rack enclosure, and the cover urging the protrusions toward the drawer to allow the drawer to be inserted into the rack enclosure when the cover is placed on the drawer. The cover may have cavities that align with the protrusions when the cover is placed on the drawer. The protrusions may be urged outward from the drawer by flexible members attached to bottom portions of sides of the drawer. The at least one structural component may be a rail of the rack enclosure. The rail may be part of the framework of the rack enclosure. The cover may include a handle for lifting the cover off of the drawer. The handle may be attached to the cover by a hinge. The hinge may allow the handle to be folded flush with the cover. Components of the drawer may include a disk drive and/or a solid state storage device. The drawer may be part of an array storage device.

BRIEF DESCRIPTION OF THE DRAWINGS

Embodiments of the system are described with reference to the several figures of the drawings, noted as follows.

DETAILED DESCRIPTION OF VARIOUS EMBODIMENTS

The system described herein provides a mechanism to ensure that a cover is replaced on a drawer of a rack enclosure when the drawer is reinserted into the rack enclosure following maintenance. The drawer includes protrusions that are urged outward from the drawer and which engage rails of the rack enclosure to prevent the drawer from sliding into the rack enclosure. The cover includes cavities that align with the protrusions so that, when the cover is placed on the drawer, the protrusions are urged inward toward the drawer to allow the drawer to be inserted fully into the rack enclosure.

Figure 1:
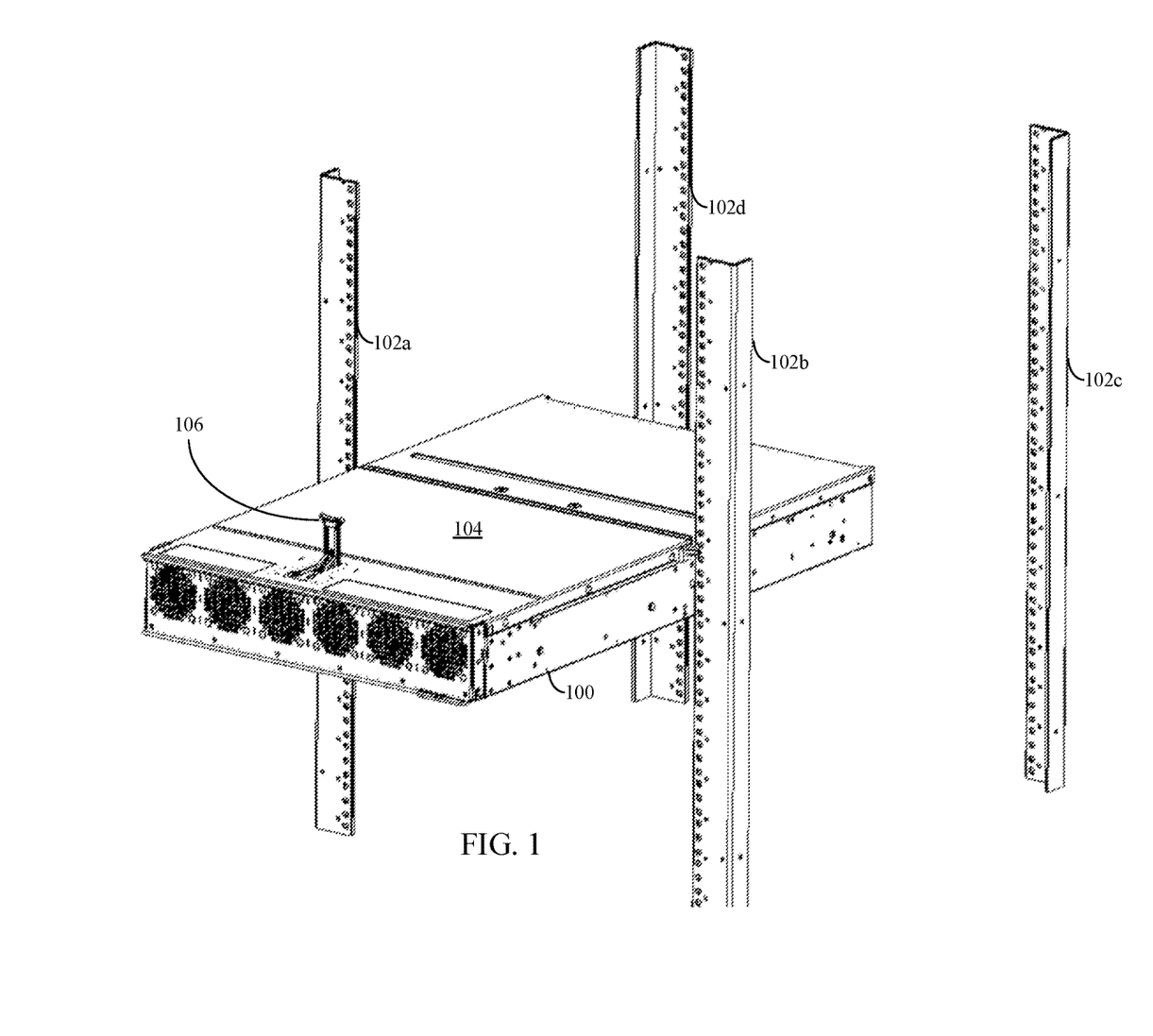
FIG. 1 is schematic diagram of a drawer and rails of a rack enclosure according to an embodiment of the system described herein.

FIG. 1 shows a drawer 100 for a rack enclosure. The drawer 100 may hold electrical components that perform a particular function, such as facilitating operation of an array storage device. For example, the rack enclosure may be an array storage device provided by Dell/EMC of Hopkinton, Mass. and the drawer 100 may contain additional storage components for the array storage device.

A plurality of rails 102a-102d for the rack enclosure are shown. The rails 102a-102d may form part of the framework for the rack enclosure, which includes other components such as side portions, a top portion, a bottom portion, etc., all of which are not shown. The drawer 100 moves in and out of the rack enclosure using, for example, conventional drawer slides (not shown), which may be attached to the rails 102a-102d or to other fixed portion(s) of the rack enclosure as well as being attached to the drawer 100. The drawer 100 has a cover 104, which may be removed using a handle 106 that is mounted on a hinge to fold flush with the cover 104 when the handle 106 is not being used. A technician may access components in the drawer 100 by first opening or removing a panel on the rack enclosure and then pulling the drawer 100 out of the rack enclosure on the slides attached to the rack enclosure and attached to the drawer 100. The technician may then remove the cover 104 using the handle 106.

Figure 2A:
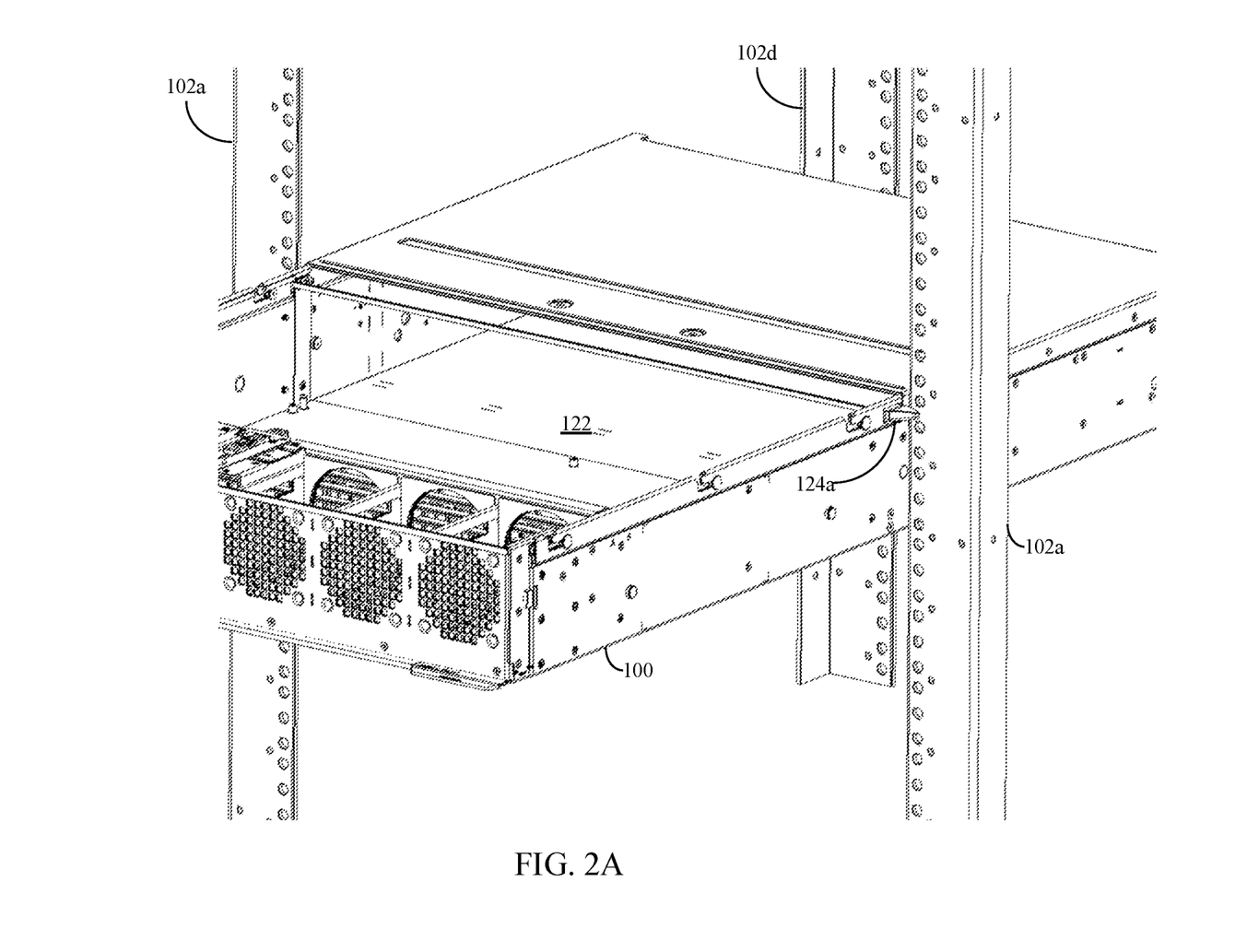
FIGS. 2A and 2B are schematic diagrams illustrating a drawer of a rack enclosure with a cover of the drawer removed according to an embodiment of the system described herein.
Figure 2B:
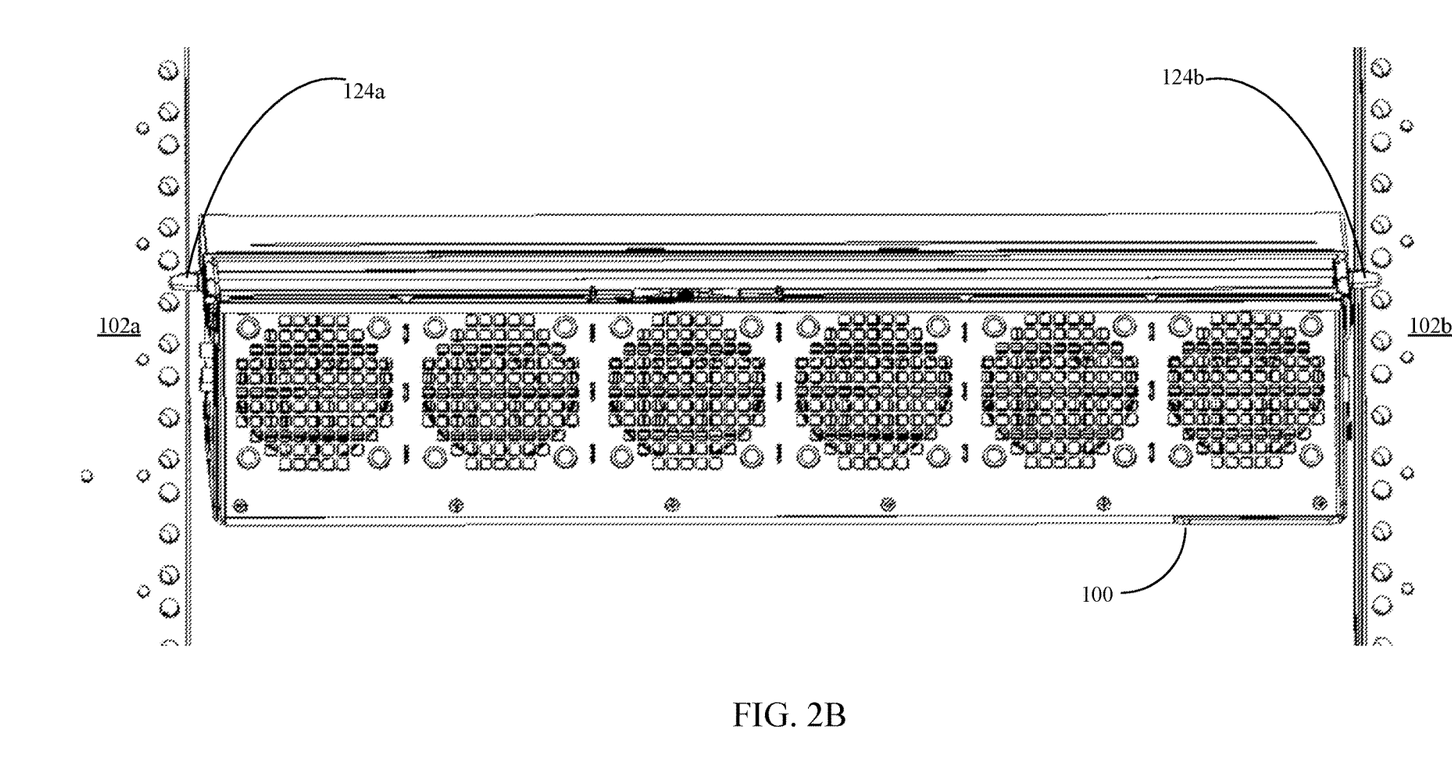

FIGS. 2A and 2B shows the drawer 100 without the cover 104. A component 122 is shown inside the drawer 100. The component 122 could be a disk drive, a solid state storage device, or some other electrical component used in connection with other components of the rack enclosure. In an embodiment herein, the drawer 100 is prevented from being removed completely and so will only be withdraw partially from the rack enclosure. In other embodiments, it may be possible to completely remove the drawer 100 from the rack enclosure. The drawer 100 includes a pair of protrusions 124a, 124b that are urged outward from the drawer 100 by a spring force. The protrusion 124a makes contact with the rail 102a and the protrusion 124b makes contact with the rail 102b to prevent the drawer 100 from sliding back in to the rack enclosure. The protrusions 102a, 102b are on opposing sides of the drawer 100. Note that any structural components of the rack enclosure, instead of the rails 102a, 102b, may be used to engage the protrusions 124a, 124b. As described in more detail elsewhere herein, placing the cover 104 back on the drawer 100 retracts the protrusions 124a, 124b to allow the drawer 100 to be slid entirely back in to the rack enclosure.

Figure 3:
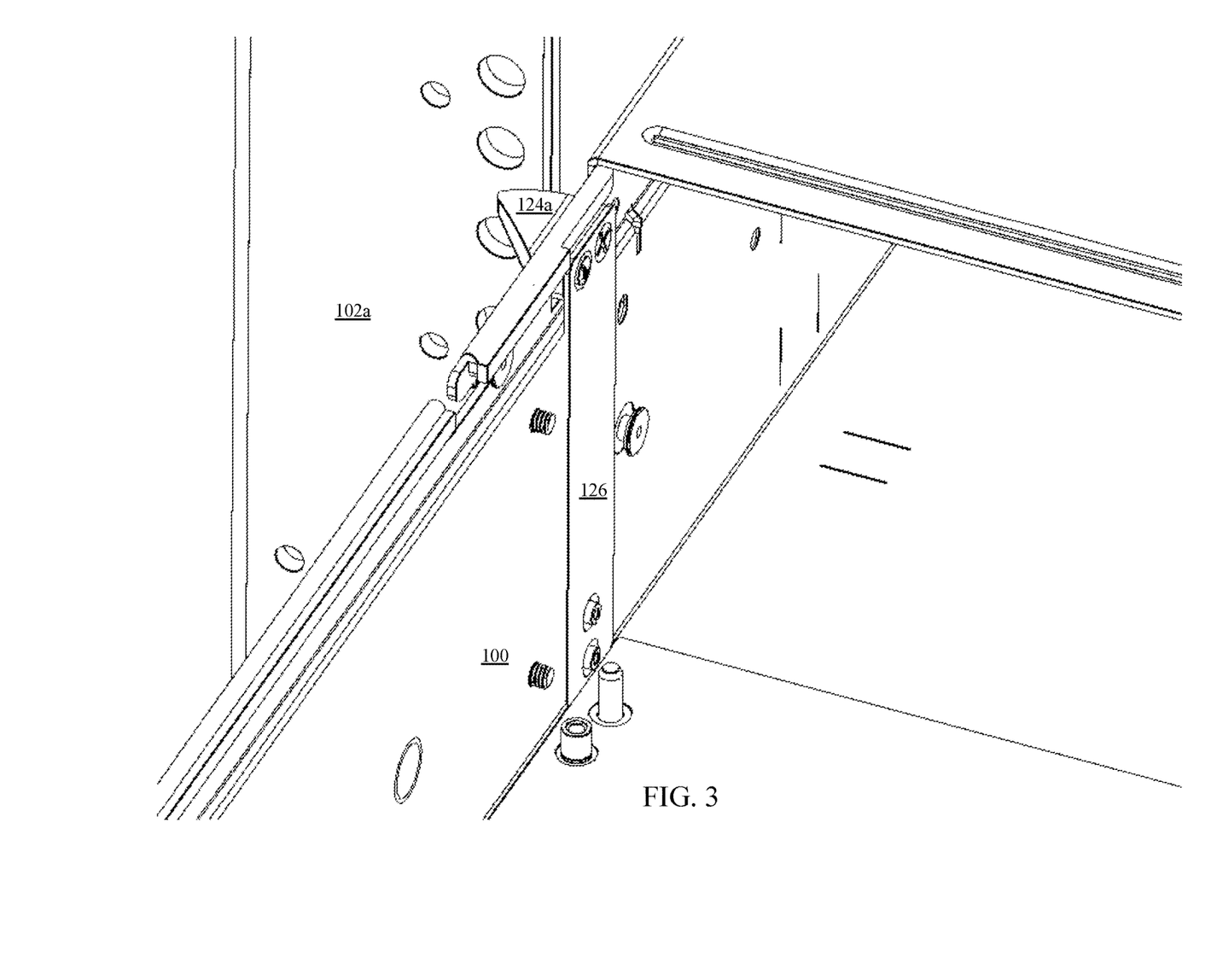
FIG. 3 is a schematic diagram illustrating a flexible member of a protrusion for a drawer of a rack enclosure according to an embodiment of the system described herein.

Referring to FIG. 3, a portion of the drawer 100 and the rail 102a is shown with the protrusion 124a engaged against the rail 102a. A flexible member 126 is shown as being attached to the drawer 100 near a bottom portion of a side of the drawer 100. The flexible member 126 urges the protrusion 124a outward from the drawer 100. A similar flexible member (not shown) is used for the other protrusion 124b on the other side of the drawer 100.

Figure 4:
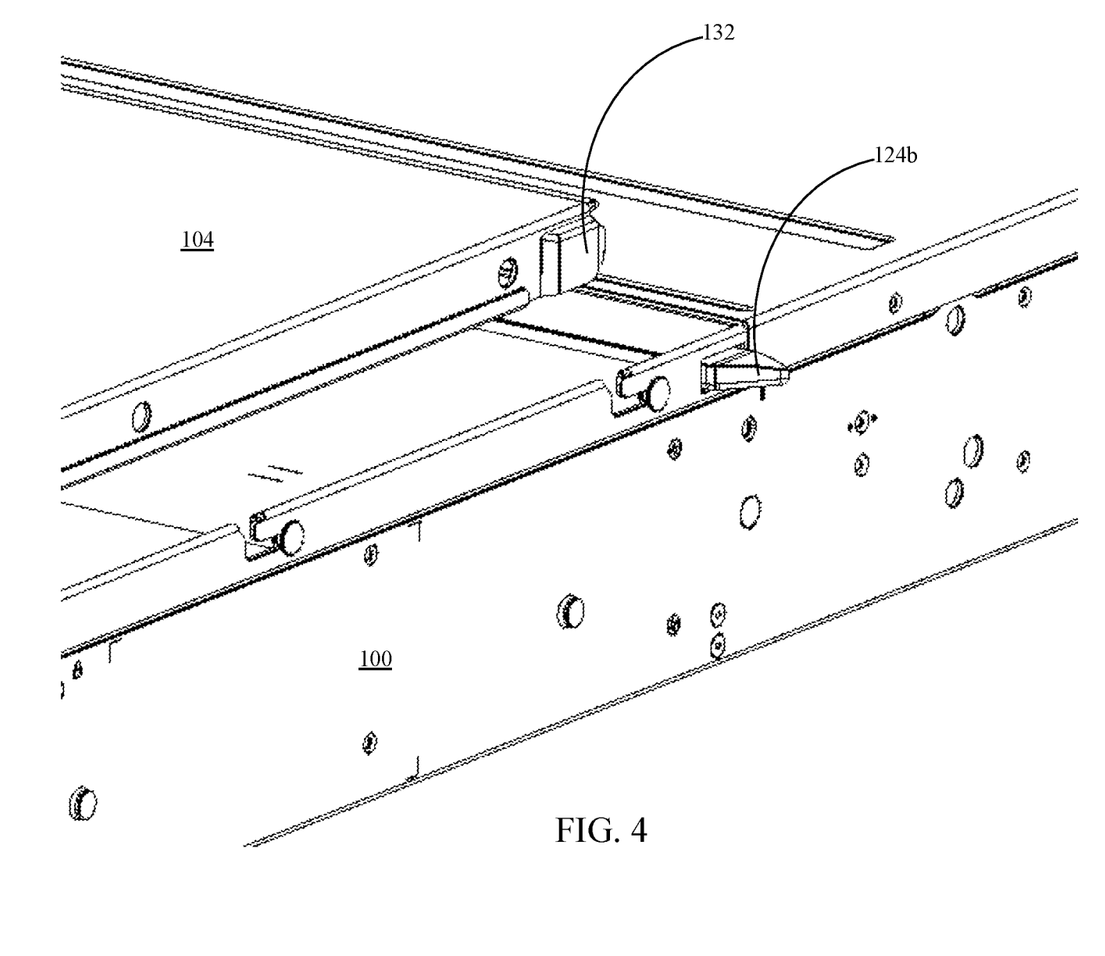
FIG. 4 is a schematic diagram illustrating alignment of a cavity in a cover and a protrusion for a drawer of a rack enclosure according to an embodiment of the system described herein.

Referring to FIG. 4, the drawer 100 is shown with the cover 104 displaced from the top of the drawer 100. The protrusion 124b is shown as extending from the drawer 100.

The cover 104 includes a cavity 132 that aligns with the protrusion 124b when the cover 104 is on top of the drawer 100. Placing the cover 104 on the drawer 100 urges the protrusion 124b inward toward the drawer 100. Although the cavity 132 provides a slight projection from the cover 104, the amount of projection is small enough to allow the drawer 100 with the cover 104 to slide past the rail 102b (not shown in FIG. 4) when the cover 104 is placed on the drawer 100

Figure 5:
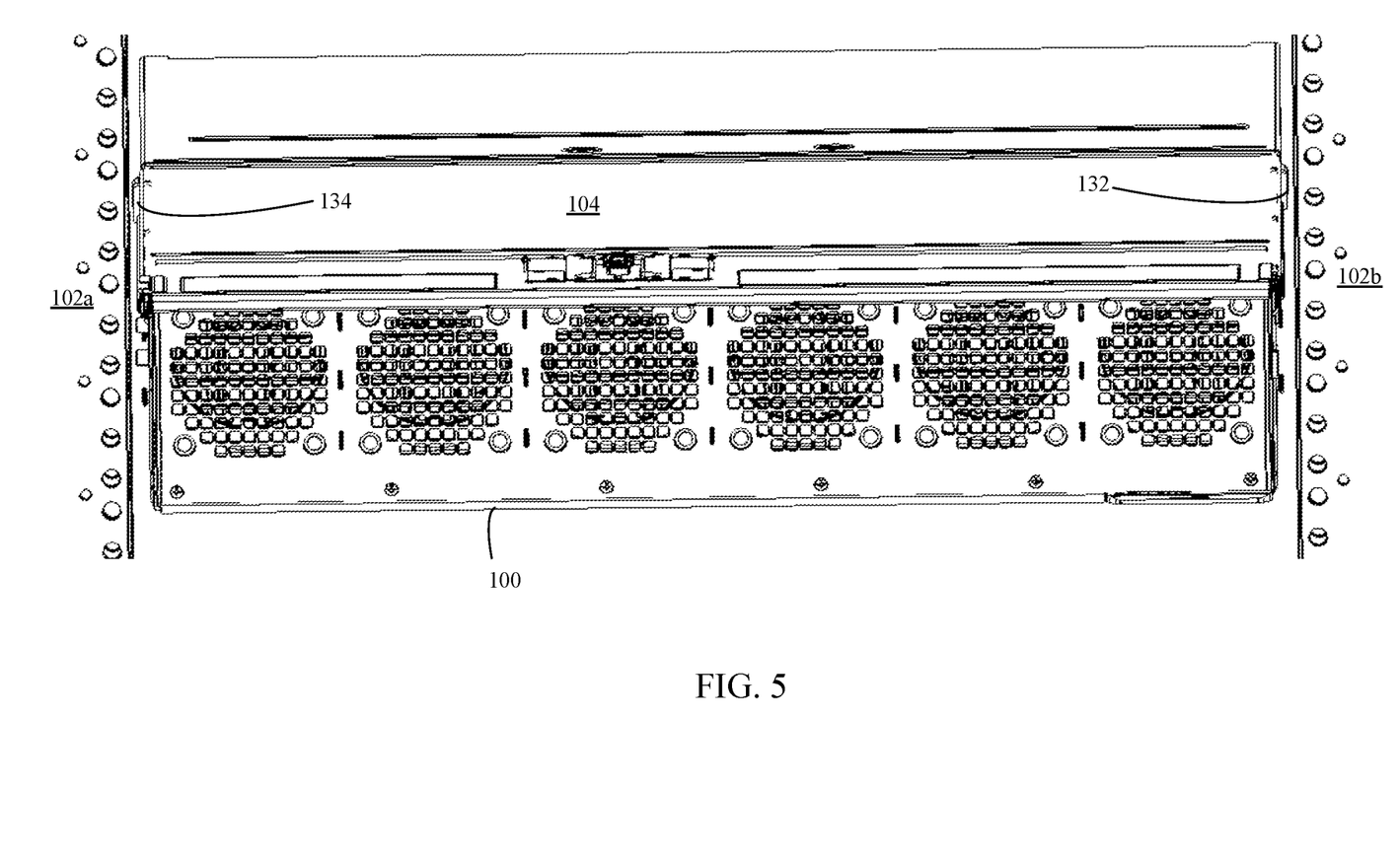
FIG. 5 is a schematic diagram illustrating cavities for a cover on a drawer of a rack enclosure according to an embodiment of the system described herein.

FIG. 5 shows the drawer 100 with the cover 104 placed on top. A cavity 136 that is similar to the cavity 134, discussed above, aligns with the protrusion 124a (not shown in FIG. 5) to urge the protrusion inward toward the drawer 100. Accordingly, when the cover 104 is placed on the drawer 100 as shown in FIG. 5, the drawer 100 may be inserted into the rack enclosure. When the cover 104 is off the drawer 100, the protrusions 124a, 124b prevent the drawer from being inserted into the rack enclosure. Thus, the cover 104 is ensured of being placed on to the drawer 100 whenever the drawer 100 is slid into the rack enclosure at the conclusion of a maintenance operation involving the drawer 100.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A cover interlock mechanism for drawer in a rack enclosure, comprising:
    a first protrusion and a second protrusion coupled to opposing sides of the drawer, the protrusions being urged outward from the drawer;
    at least one structural component of the rack enclosure that engages the protrusions to prevent the drawer from being inserted into the rack enclosure; and
    a cover for the drawer having cavities that align with the protrusions when the cover is placed on the drawer to urge the protrusions toward the drawer to allow the drawer to be inserted into the rack enclosure.

2. A cover interlock mechanism, according to claim 1, wherein the protrusions are urged outward from the drawer by flexible members attached to the drawer.

3. A cover interlock mechanism, according to claim 2, wherein the flexible members are attached to bottom portions of sides of the drawer.

4. A cover interlock mechanism, according to claim 1, wherein the at least one structural component is a rail of the rack enclosure.

5. A cover interlock mechanism, according to claim 4, wherein the rail is part of the framework of the rack enclosure.

6. A cover interlock mechanism, according to claim 1, wherein the cover includes a handle for lifting the cover off of the drawer.

7. A cover interlock mechanism, according to claim 6, wherein the handle is attached to the cover by a hinge.

8. A cover interlock mechanism, according to claim 7, wherein the hinge allows the handle to be folded flush with the cover.

9. A cover interlock mechanism, according to claim 1, wherein components of the drawer include at least one of: a disk drive and a solid state storage device.

10. A cover interlock mechanism, according to claim 9, wherein the drawer is part of an array storage device.

11. A method of preventing a drawer in a rack enclosure from sliding into the rack enclosure without a cover, comprising:

urging a first protrusion and a second protrusion, coupled to opposing sides of the drawer, outward from the drawer;

engaging the protrusions to prevent the drawer from being inserted into the rack enclosure; and the cover urging the protrusions toward the drawer to allow the drawer to be inserted into the rack enclosure when the cover is placed on the drawer.

12. A method, according to claim 11, wherein the cover has cavities that align with the protrusions when the cover is placed on the drawer.

13. A method, according to claim 11, wherein the protrusions are urged outward from the drawer by flexible members attached to bottom portions of sides of the drawer.

14. A method, according to claim 11, wherein the at least one structural component is a rail of the rack enclosure.

15. A method, according to claim 14, wherein the rail is part of the framework of the rack enclosure.

16. A method, according to claim 11, wherein the cover includes a handle for lifting the cover off of the drawer.

17. A method, according to claim 16, wherein the handle is attached to the cover by a hinge.

18. A method, according to claim 17, wherein the hinge allows the handle to be folded flush with the cover.

19. A method, according to claim 11, wherein components of the drawer include at least one of: a disk drive and a solid state storage device.

20. A method, according to claim 19, wherein the drawer is part of an array storage device.

* * * * *